United States Patent
Porob et al.

(10) Patent No.: US 9,938,457 B1
(45) Date of Patent: Apr. 10, 2018

(54) METHODS FOR FABRICATING DEVICES CONTAINING RED LINE EMITTING PHOSPHORS

(71) Applicant: General Electric Company, Schenectady, NY (US)

(72) Inventors: Digamber Gurudas Porob, Karnataka (IN); James Edward Murphy, Niskayuna, NY (US); Florencio Garcia, Schenectady, NY (US); Srinivas Prasad Sista, Altamont, NY (US); Anant Achyut Setlur, Niskayuna, NY (US); William Winder Beers, Chesterland, OH (US); Fangming Du, Hudson, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/270,657

(22) Filed: Sep. 20, 2016

(51) Int. Cl.
*C09K 11/61* (2006.01)
*H01L 33/00* (2010.01)
(Continued)

(52) U.S. Cl.
CPC ........ *C09K 11/617* (2013.01); *H01L 25/0753* (2013.01); *H01L 33/0095* (2013.01);
(Continued)

(58) Field of Classification Search
CPC ..... C09K 11/617; H01L 33/502; H01L 33/06; H01L 33/32; H01L 33/56; H01L 33/0095;
(Continued)

(56) References Cited

U.S. PATENT DOCUMENTS

| | | |
|---|---|---|
| 6,890,234 B2 | 5/2005 | Bortscheller et al. |
| 7,497,973 B2 | 3/2009 | Radkov et al. |

(Continued)

FOREIGN PATENT DOCUMENTS

| | | |
|---|---|---|
| CN | 102255033 B | 4/2013 |
| CN | 105226165 A | 1/2016 |

OTHER PUBLICATIONS

Abe S., Dilutable recycled photovoltaic silicon wafer cutting solution comprises higher alcohol, organic amine, surfactant and pure waterCN-106118838, Nov. 16, 2016.*

(Continued)

*Primary Examiner* — Caleen Sullivan
(74) *Attorney, Agent, or Firm* — GE Global Patent Operation

(57) ABSTRACT

Methods for fabricating coated semiconductor elements are presented. The methods include the steps of combining a phosphor of formula I and a polymer binder to form a composite material, providing a semiconductor wafer including $In_iGa_jAl_kN$, wherein $0 \le i$; $0 \le j$; $0 \le k$, and a sum of i, j and k is equal to 1, coating the composite material on a surface of the semiconductor wafer to form a coated semiconductor wafer, and dicing the coated semiconductor wafer using a cutting fluid apparatus to form one or more coated semiconductor elements. A cutting fluid of the cutting fluid apparatus includes a $C_1$-$C_{20}$ alcohol, a $C_1$-$C_{20}$ ketone, a $C_1$-$C_{20}$ acetate compound, acetic acid, oleic acid, carboxylic acid, a source of A, silicic acid, or a combination thereof.

12 Claims, 1 Drawing Sheet

Figure 1:
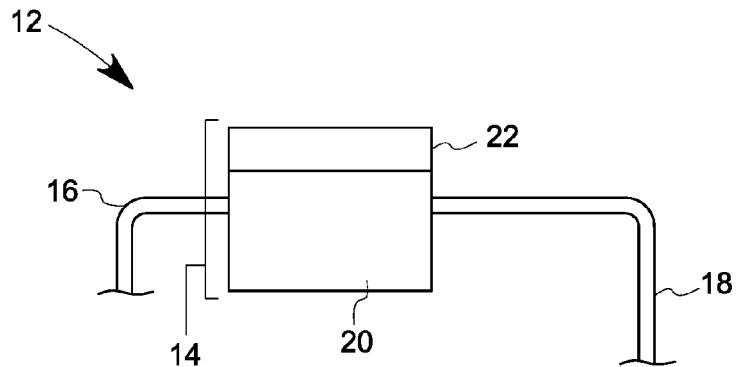

(51) Int. Cl.
*H01L 33/06* (2010.01)
*H01L 33/32* (2010.01)
*H01L 33/56* (2010.01)
*H01L 33/50* (2010.01)
*H01L 33/62* (2010.01)
*H01L 25/075* (2006.01)

(52) U.S. Cl.
CPC .............. *H01L 33/06* (2013.01); *H01L 33/32* (2013.01); *H01L 33/502* (2013.01); *H01L 33/56* (2013.01); *H01L 33/62* (2013.01); *H01L 2933/005* (2013.01); *H01L 2933/0041* (2013.01); *H01L 2933/0066* (2013.01)

(58) Field of Classification Search
CPC ................ H01L 33/62; H01L 25/0753; H01L 2933/0041; H01L 2933/005; H01L 2933/0066
USPC .......................................................... 438/27
See application file for complete search history.

(56) References Cited

U.S. PATENT DOCUMENTS

| | | | |
|---|---|---|---|
| 7,696,522 | B2 | 4/2010 | Ono et al. |
| 8,852,971 | B2 | 10/2014 | Kim et al. |
| 9,172,012 | B2 | 10/2015 | Andrews et al. |
| 2007/0001178 | A1 | 1/2007 | Tran et al. |
| 2007/0269586 | A1 | 11/2007 | Leatherdale et al. |
| 2009/0179207 | A1 | 7/2009 | Chitnis et al. |
| 2010/0009517 | A1* | 1/2010 | Collier ................ B28D 5/0076 438/460 |
| 2011/0278616 | A1* | 11/2011 | Washizu ................ H05B 33/10 257/98 |
| 2013/0330853 | A1 | 12/2013 | Tischler |
| 2015/0357528 | A1* | 12/2015 | Tsumori ................ C09K 11/617 257/98 |

OTHER PUBLICATIONS

Y. Liu et al., "Process optimization of lead-free wafer-level underfill material used in chip scale packaging", Advanced Packaging Materials: Processes, Properties and Interfaces, 2005. Proceedings. International Symposium, Mar. 16-18, 2005, 5 Pages.

Qin et al., "Effect of temperature and moisture on the luminescence properties of silicone filled with YAG phosphor", Journal of Semiconductors, vol. 32, No. 1, Jan. 2011, 3 Pages.

L. Kunzhui et al., "Deep considerations on LED package technology", Solid State Lighting (SSLCHINA), 2015 12th China International Forum, Nov. 2-4, 2015, Conference Location: Shenzhen, pp. 8-11.

* cited by examiner

METHODS FOR FABRICATING DEVICES CONTAINING RED LINE EMITTING PHOSPHORS

BACKGROUND

Red-emitting phosphors based on complex fluoride materials activated by $Mn^{4+}$, such as those described in U.S. Pat. Nos. 7,358,542, 7,497,973, and 7,648,649, can be utilized in combination with yellow/green emitting phosphors such as YAG:Ce or other garnet compositions to achieve warm white light (CCTs<5000 K on the blackbody locus, color rendering index (CRI>80)) from a blue LED, equivalent to that produced by current fluorescent, incandescent and halogen lamps. These materials absorb blue light strongly and efficiently emit between about 610-635 nanometers (nm) with little deep red/NIR emission. Therefore, luminous efficacy is maximized compared to other red phosphors that have significant emission in the deeper red where eye sensitivity is poor. Quantum efficiency can exceed to 85% under blue (440-460 nm) excitation.

While the efficacy and CRI of lighting systems using $Mn^{4+}$ activated (or doped) complex fluoride materials can be quite high, one potential limitation is material's susceptibility to degradation under fabrication and use conditions, for example high temperature and humidity (HTHH) conditions. It may be possible to reduce the degradation of the material using post-synthesis processing steps, as described in U.S. Pat. No. 8,252,613. However, development of improved methods for reducing or preventing degradation of the materials is desirable.

BRIEF DESCRIPTION

Briefly, in one aspect, the present disclosure relates to methods for fabricating coated semiconductor elements for use in forming one or more LED chips. The methods include the steps of combining a phosphor of formula I: $A_x[(M,Mn)F_y]$ and a polymer binder to form a composite material, providing a semiconductor wafer including $In_iGa_jAl_kN$, wherein $0 \leq i$; $0 \leq j$; $0 \leq k$, and a sum of i, j and k is equal to 1, coating the composite material on a surface of the semiconductor wafer to form a coated semiconductor wafer, and dicing the coated semiconductor wafer using a cutting fluid apparatus to form one or more coated semiconductor elements. A cutting fluid of the cutting fluid apparatus includes a $C_1$-$C_{20}$ alcohol, a $C_1$-$C_{20}$ ketone, a $C_1$-$C_{20}$ acetate compound, acetic acid, oleic acid, carboxylic acid, a source of A, silicic acid, or a combination thereof. A independently at each occurrence is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge on an $[(M,Mn)F_y]$ ion, and y is 5, 6, or 7.

In another aspect, the present disclosure relates to a lighting apparatus. The lighting apparatus includes one or more LED chips fabricated by a method including the steps of combining a phosphor of formula I and a polymer binder to form a composite material, providing a semiconductor wafer including $In_iGa_jAl_kN$, wherein $0 \leq i$; $0 \leq j$; $0 \leq k$, and where a sum of i, j and k is equal to 1, coating the composite material on a surface of the semiconductor wafer to form a coated semiconductor wafer, dicing the coated semiconductor wafer using a cutting fluid apparatus to form one or more coated semiconductor elements, and coupling electrical leads to the one or more coated semiconductor elements to form one or more LED chips. A cutting fluid of the cutting fluid apparatus includes a $C_1$-$C_{20}$ alcohol, a $C_1$-$C_{20}$ ketone, a $C_1$-$C_{20}$ acetate compound, acetic acid, oleic acid, carboxylic acid, a source of A, silicic acid, or a combination thereof.

In yet another aspect, the present disclosure relates to a method for fabricating one or more LED chips. The method includes the steps of combining $K_2[SiF_6]:Mn^{4+}$ and a polymer binder to form a composite material, providing a semiconductor wafer including $In_iGa_jAl_kN$, wherein $0 \leq i$; $0 \leq j$; $0 \leq k$, and a sum of i, j and k is equal to 1, coating the composite material on a surface of the semiconductor wafer to form a coated semiconductor wafer, dicing the coated semiconductor wafer using a cutting fluid apparatus to form one or more coated semiconductor elements, and coupling electrical leads to the one or more coated semiconductor elements to form one or more LED chips. A cutting fluid of the cutting fluid apparatus includes $K_2[SiF_6]$.

DRAWINGS

Figure 2:
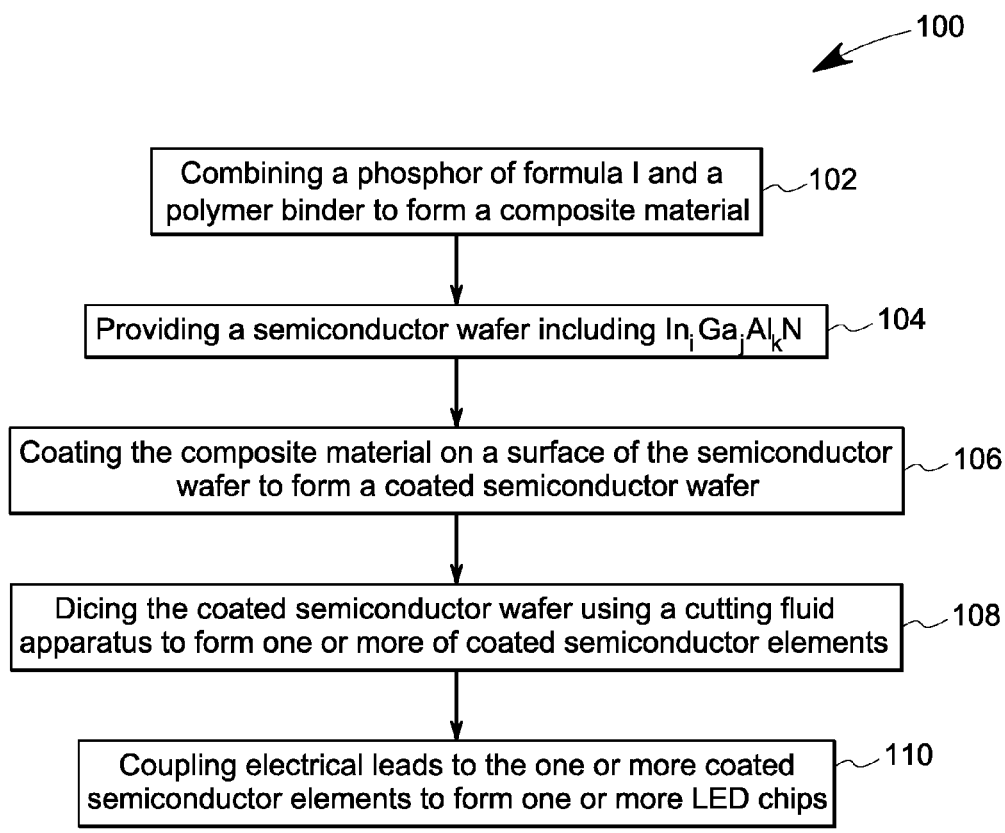

These and other features, aspects, and advantages of the present invention will become better understood when the following detailed description is read with reference to the accompanying drawing, wherein:

FIG. 1 is a schematic cross-sectional view of an LED chip, in accordance with one embodiment of the present disclosure; and FIG. 2 shows a flow chart of a method for fabricating one or more LED chips, in accordance with another embodiment of the present disclosure.

DETAILED DESCRIPTION

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about" and "substantially" is not limited to the precise value specified. In some instances, the approximating language may correspond to the precision of an instrument for measuring the value.

As used herein, the terms "phosphor", "phosphor composition", and "phosphor material" may be used to denote both a single phosphor as well as blends of two or more phosphors. As used herein, the terms "lamp", "lighting apparatus", and "lighting system" refer to any source of visible and ultraviolet light, which can be generated by at least one light emitting element producing a light emission when energized, for example, a phosphor material or a light emitting diode.

As used herein, the term "coating" refers to a material disposed on at least a portion of an underlying surface in a continuous or discontinuous manner. Further, the term "coating" does not necessarily mean a uniform thickness of the disposed material, and the disposed material may have a uniform or a variable thickness. As used herein, the term "coated on" refers to coatings or materials disposed directly in contact with each other or indirectly by having intervening coatings or materials or features there between, unless otherwise specifically indicated.

As used herein, the term "semiconductor wafer" refers to a wafer or a substrate of a semiconductor material such as a growth substrate. A growth substrate is typically grown from a semiconductor material, and includes one or more device structures having a light emitting region disposed between an n-type region and a p-type region. In some embodiments, the semiconductor wafer includes one or more light emitting device (LED) structures.

Some embodiments of the present disclosure are directed to methods for fabricating one or more coated semiconductor elements to form LED chips for use in lighting apparatus, for example LED devices. A coated semiconductor element as described herein may include a semiconductor substrate including an LED device structure and a coating of a composite material including a phosphor of formula I. A coated semiconductor element may also be referred to as a phosphor coated semiconductor element. In a lighting apparatus, electrical leads may be coupled to the one or more coated semiconductor elements to form one or more LED chips.

FIG. 1 illustrates a configuration of an LED chip 12. The LED chip 12 includes a coated semiconductor element 14 and electrical leads 16 and 18 coupled to the coated semiconductor element 14. The coated semiconductor element 14 includes a semiconductor substrate 20 including an LED device structure and a coating 22 of a composite material disposed on a portion of a surface 21 of the semiconductor substrate 20. In some embodiments, electrical leads 16 and 18 form electrical connections to the semiconductor substrate 20.

In some embodiments, a method for fabricating coated semiconductor elements is described. The method includes combining a phosphor of formula I and a polymer binder to form a composite material, providing a semiconductor wafer including $In_iGa_jAl_kN$, wherein $0 \leq i$; $0 \leq j$; $0 \leq k$, and a sum of I, j and k is equal to 1, coating the composite material on a surface of the semiconductor wafer to form a coated semiconductor wafer, and dicing the coated semiconductor wafer using a cutting fluid apparatus to separate one or more coated semiconductor elements. A cutting fluid of the cutting fluid apparatus includes a $C_1$-$C_{20}$ alcohol, a $C_1$-$C_{20}$ ketone, a $C_1$-$C_{20}$ acetate compound, acetic acid, oleic acid, carboxylic acid, a source of A, where A is Li, Na, K, Rb, Cs, or a combination thereof, silicic acid, or a combination thereof. The method further includes coupling electrical leads to the one or more coated semiconductor elements to form one or more LED chips, for example the LED chip 12 (FIG. 1).

The semiconductor wafer including $In_iGa_jAl_kN$ as described herein may include a plurality of LED device structures. In some embodiments, each LED device structure includes a p-type region, an active region, and an n-type region. The active region may include a multi-quantum well. Each LED device structure of the plurality of LED device structures may emit light in a wavelength range from about 250 nanometers (nm) to about 550 nm when the LED device structure is forward biased. In some embodiments, the semiconductor wafer includes GaN, and the LED device structures emit blue light having a peak emission wavelength from about 400 nm to about 500 nm.

Although in the description herein, the lighting apparatus for example, LED devices are nitride-based LEDs that emit blue or UV light, semiconductor light emitting devices besides LEDs such as laser diodes and semiconductor light emitting devices made from other materials such as other III-V semiconductor materials, III-phosphide, III-arsenide, II-VI semiconductor materials, ZnO, or Si-based materials may be used.

The phosphor of formula I is a complex fluoride. In one embodiment, the phosphor of formula I is a manganese ($Mn^{4+}$) doped complex fluoride. Complex fluorides have a host lattice containing one coordination center, surrounded by fluoride ions acting as ligands, and charge-compensated by counter ions (A) as required. For example, in $K_2[SiF_6]$, the coordination center is Si and the counter ion is K. Complex fluorides are generally represented as a combination of simple, binary fluorides. The square brackets in the chemical formula for the complex fluorides (occasionally omitted for simplicity) indicate that the complex ion present in that complex fluoride is a new chemical species, different from the simple fluoride ion. In the phosphor of formula I, the $Mn^{4+}$ dopant or activator acts as an additional coordination center, substituting a part of the coordination center, for example, Si, forming a luminescent center. The manganese doped phosphor of formula I: $A_2(M,Mn)F_6$ may also be represented as $A_2[MF_6]:Mn^{4+}$. The host lattice (including the counter ions) may further modify the excitation and emission properties of the activator ion. As used herein, the terms "phosphor of formula I" and "manganese doped phosphor" may be used interchangeably throughout the specification.

The counter ion A in formula I is Li, Na, K, Rb, Cs, or a combination thereof, and y is 6. In certain embodiments, A is Na, K, or a combination thereof. The coordination center M in formula I is an element selected from the group consisting of Si, Ge, Ti, Zr, Hf, Sn, Al, Ga, In, Sc, Y, Bi, La, Gd, Nb, Ta, and combinations thereof. In certain embodiments, M is Si, Ge, Ti, or a combination thereof. In some embodiments, A is K and M is Si. Examples of the phosphors of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_2[NbF_7]:Mn^{4+}$ and $K_2[TaF_7]:Mn^{4+}$. In certain embodiments, the phosphor of formula I is $K_2[SiF_6]:Mn^{4+}$.

Other manganese doped phosphors that may be used in forming the composite material for coating the semiconductor wafer to subsequently form one or more LED chips, include:

(A) $A_2[MF_5]:Mn^{4+}$, where A is selected from Li, Na, K, Rb, Cs, and combinations thereof; and where M is selected from Al, Ga, In, and combinations thereof;

(B) $A_3[MF_6]:Mn^{4+}$, where A is selected from Li, Na, K, Rb, Cs, and combinations thereof; and where M is selected from Al, Ga, In, and combinations thereof;

(C) $Zn_2[MF_7]:Mn^{4+}$, where M is selected from Al, Ga, In, and combinations thereof;

(D) $A[In_2F_7]:Mn^{4+}$ where A is selected from Li, Na, K, Rb, Cs, and combinations thereof;

(E) $E[MF_6]:Mn^{4+}$, where E is selected from Mg, Ca, Sr, Ba, Zn, and combinations thereof; and where M is selected from Ge, Si, Sn, Ti, Zr, and combinations thereof;

(F) $Ba_{0.65}Zr_{0.35}F_{2.70}:Mn^{4+}$; and (G) $A_3[ZrF_7]:Mn^{4+}$ where A is selected from Li, Na, K, Rb, Cs, and combinations thereof.

The phosphor of formula I for use in forming the composite material may have a particle size distribution having a D50 particle size of less than 50 microns. In some embodiments, the phosphor of formula I has a D50 particle size in a range from about 1 micron to about 50 microns. In some embodiments, the phosphor of formula I has D50 particle size in a range from about 10 microns to about 40 microns. In particular embodiments, the phosphor of formula I has a D50 particle size in a range from about 20 microns to about 35 microns. In some embodiments, it may be desirable to use particles having smaller particle size, for example a D50 particle size of less than 1 micron.

The polymer binder may include a material that is optically transparent to light emitted by the LED device structure, the phosphor of formula I, an additional luminescent material (described below) or combinations thereof of a resulting LED chip. Further, the polymer binder may be chemically and optically compatible with the phosphor of formula I and any surrounding materials or layers used in the LED chip or a lighting apparatus including the LED chip. Suitable examples of the polymer binders for use in forming the composite material may include epoxies, silicones and silicones derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; a low temperature glass, or combinations thereof. In some embodiments, the polymer binder is substantially free of water, substantially free of a base, or substantially free of water and the base. As used herein, the terms "substantially free of water" and "substantially free of a base" are used in context of a polymer binder that may include less than 1 weight percent water, less than 1 weight percent of the base, or less than 1 weight percent of water and the base.

As noted, the method includes the step of combining the phosphor of formula I and the polymer binder to form a composite material. For example, a slurry of the composite material may be prepared by mixing the phosphor of formula I to the polymer binder. The phosphor of formula I may be dispersed uniformly or non-uniformly in the polymer binder. In some embodiments, the combining step includes stirring a combination of the phosphor of formula I and the polymer binder homogeneously with a stirring rate. In some embodiments, the combining step may be performed by stirring the combination of the phosphor of formula I and the polymer binder with a stirring rate less than 500 rpm. In some embodiments, the combining step may be performed by stirring the combination with a stirring rate less than 400 rpm. In certain embodiments, the combining step may be performed by stirring the combination with a stirring rate in a range from about 100 rpm to about 300 rpm. The stirring of the combination of the phosphor of formula I and the polymer binder in the combining step may be carried out for a duration of time depending on a selected stirring rate to achieve the desired properties. A low stirring rate (less than 500 rpm) may reduce the cleavage of the particles of the phosphor of formula I as compared to that of a high stirring rate (higher than 500 rpm). The reduced cleavage of particles may help in maintaining their shape and retaining their surfaces without any damage, deformation and erosion during the combining step for forming the composite material. Further, the combining step may be carried out at a temperature less than 200 degrees Celsius. In some embodiments, the combining step is carried out at room temperature. In some other embodiments, the combining step is carried out at a temperature less than 150 degrees Celsius. In some embodiments, the combining step is carried out at a temperature less than 100 degrees Celsius.

After forming the composite material, the method includes coating the composite material on a surface of the semiconductor wafer to form a coated semiconductor wafer. In some embodiments, prior to coating the composite material, the method further includes forming electrical contacts on the surface of the semiconductor wafer. In some embodiments, after forming electrical contacts, a protective material, for example a photoresist may be applied to the electrical contacts using a suitable method such as lithography prior to the step of coating the composite material. Next, the method includes coating the composite material on a surface of the semiconductor wafer including electrical contacts. In some embodiments, the method includes coating one or more portions of the surface of the semiconductor wafer including the electrical contacts, which are not covered by the photoresist. In some other embodiments, after forming the electrical contacts on the surface of the semiconductor wafer, the method includes coating the composite material across the entire surface of the semiconductor wafer. That is, the entire surface of the semiconductor wafer including the electrical contacts may be covered by a coating of the composite material. In these embodiments, a protective material such as a photoresist may be applied on the coating of the composite material using a suitable method such as lithography, and the protective material may be removed in regions above the electrical contacts. In some embodiments, the protective layer may be applied on the coating of the composite material (or composite material coating) except the regions above the electrical contacts. After the protective layer has been applied and treated as required, the composite material coating on or above the electrical contacts may be removed by any suitable method such as wet etching or dry etching. After removing the portions of the composite material coating as required, the protective layer may be removed completely from the composite material coating.

Various methods may be employed for coating the composite material on a surface of the semiconductor wafer. Non-limiting examples of methods for coating the composite material may include spin coating, screen printing, dispensing, spray coating, inject printing, or dipping method. In certain embodiments, the composite material coating is applied by spin coating method. A temperature during the formation of the composite material coating may be maintained less than 200 degrees Celsius. In some embodiments, a temperature during the formation of the composite material coating is maintained less than 150 degrees Celsius. In certain embodiments, a temperature during the formation of the composite material coating is maintained less than 100 degrees Celsius.

After coating the composite material on the semiconductor wafer, the method may further include heat-treating the composite material coating. The step of heat-treating the composite material coating may be carried out prior to or after applying the protective layer (described above). Various methods, for example using a heater, an oven, dried air or radiant heat lamp may be employed to perform the heat-treating of the composite material coating. In some embodiments, the method includes heat-treating the composite material coating at a temperature less than 200 degrees Celsius. In some embodiments, the step of heat-treating the composite material coating is carried out at a temperature less than 150 degrees Celsius. In certain embodiments, the step of heat-treating the composite material coating is carried out at a temperature less than 100 degrees Celsius. The step of heat-treating the composite material coating may be carried out for a duration of time depending on a selected temperature to achieve desired purpose, for example evaporate the moisture content of the composite material coating. After completing the step of heat-treating, the composite material coating may be patterned to improve light extraction.

In the next step, the method includes dicing the coated semiconductor wafer to form one or more coated semiconductor elements. The dicing step may include dicing the coated semiconductor wafer using a cutting fluid apparatus to form one or more coated semiconductor elements. A cutting fluid apparatus generally uses a non-compressible cutting fluid to generate a high-pressure pulsating flow of the cutting fluid. Examples of the cutting fluid apparatus may include a fluid jet or a fluid saw. A fluid jet typically uses cutting fluids at ultra-high pressures, for example higher than 30,000 Pounds per square inch (PSI) for forming an intense cutting fluid stream through a cutting nozzle. The energy required for cutting a material is obtained by pressurizing the cutting fluid by a booster pump to a desired level and channeling the pressurized cutting fluid to the cutting nozzle.

According to some embodiments, a cutting fluid of the cutting fluid apparatus includes a compound selected from the group consisting of a $C_1$-$C_{20}$ alcohol, a $C_1$-$C_{20}$ ketone, a $C_1$-$C_{20}$ acetate compound, acetic acid, oleic acid, carboxylic acid, a source of A, silicic acid, and combinations thereof. Suitable examples of the compound may include, but are not limited to, ethanol, acetone, isopropyl alcohol, tertiary butyl alcohol, tertiary butyl acetate, octanol, acetic acid, oleic acid, carboxylic acid or combinations thereof. In some embodiments, the cutting fluid may include additional compounds for example, an alkane having higher than 4 carbon atoms and an alkene higher than 4 carbon atoms. Suitable examples of alkanes include hexane, octane, or a combination thereof. In some embodiments, the cutting fluid includes an aqueous solution of the compound. The cutting fluid may include an aqueous solution having a concentration of about 1 to about 50 percent of the compound. In an example, an aqueous solution of 50 percent acetone may be used in the cutting fluid apparatus.

Non-limiting suitable examples of the sources of A include KCl, KBr, KF, $CaF_2$, a compound of formula II or combinations thereof. The compound of formula II is represented as:

$$A_x[MF_y]$$  II wherein A is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge of an $[MF_y]$ ion; and y is 5, 6, or 7. In certain embodiments, A is K and M is Si. In certain embodiments, the compound of formula II is $K_2[SiF_6]$. In certain embodiments, the cutting fluid includes an aqueous solution of $K_2[SiF_6]$.

In some embodiments, the dicing step includes using the cutting fluid from the cutting fluid apparatus at a pressure in a range from about 36,000 PSI to about 100,000 PSI. In some embodiments, the cutting fluid apparatus uses the cutting fluid at a pressure in a range from about 40,000 PSI to about 60,000 PSI.

Without being bound by any theory, it is believed that using a cutting fluid apparatus for dicing the coated semiconductor wafer into one or more coated semiconductor elements may reduce the degradation of the phosphor of formula I in the coating of the composite material as compared to the degradation of the phosphor of formula I when a water jet is used for dicing the coated semiconductor wafer.

In addition to the phosphor of formula I, one or more additional luminescent materials, for example inorganic phosphors, quantum dot (QD) materials, electroluminescent polymers, and phosphorescent dyes may be disposed on the semiconductor wafer. Additional luminescent materials emitting radiation of, for example green, blue, yellow, red, orange, or other colors may be used to customize a resulting light such as white light from the LED chip with correlated color temperature (CCTs) in the range of 2500-10000K and CRIs in the range of 50-99. In certain embodiments, an additional luminescent material includes a green emitting phosphor, such as $Ce^{3+}$ doped garnet phosphor.

In some embodiments, the step of combining the phosphor of formula I and the polymer binder (as described previously) further includes adding an additional luminescent material in the polymer binder along with the phosphor of formula I. For example, the phosphor of formula I may be blended with one or more additional luminescent material, for example green, blue, yellow, orange, or red emitting phosphors or QD materials in the polymer binder to form the composite material. In some other instances, the additional luminescent material may be disposed separately on the semiconductor wafer either prior to or after coating the composite material including the phosphor of formula I on the semiconductor wafer. The additional luminescent material may be dispersed in any polymer binder (as described previously), separately, and a layer may be disposed on the semiconductor wafer.

Suitable additional phosphors for use in the coated semiconductor wafer may include, but are not limited to: $((Sr_{1-z}(Ca, Ba, Mg, Zn)_z)_{1-(x+w)}(Li, Na, K, Rb)_wCe_x)_3 (Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$; $(Ca, Ce)_3Sc_2Si_3O_{12}(CaSig)$; $(Sr,Ca,Ba)_3Al_{1-x}Si_xO_{4+x}F_{1-x}:Ce^{3+}$ (SASOF)); $(Ba,Sr,Ca)_5(PO_4)_3(Cl,F,Br,OH): Eu^{2+},Mn^{2+}$; $(Ba,Sr,Ca)BPO_5:Eu^{2+},Mn^{2+}$; $(Sr,Ca)_{10}(PO_4)_6 \cdot vB_2O_3:Eu^{2+}$ (wherein $0<v\leq1$); $Sr_2Si_3O_8 \cdot 2SrCl_2:Eu^{2+}$;$(Ca,Sr,Ba)_3MgSi_2O_8:Eu^{2+},Mn^{2+}$; $BaAl_8O_{13}:Eu^{2+}$; $2SrO \cdot 0.84P_2O_5 \cdot 0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$;$ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $-0.2\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_\beta Si_\gamma N_\mu:Eu^{2+}$ (wherein $2\beta+4\gamma=3\mu$); $(Ba,Sr,Ca)_2Si_{5-x}Al_xN_{8-x}O_x:Eu^{2+}$ (wherein $0\leq x\leq2$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $0.5\leq u\leq1$, $0<v\leq0.1$, and $0\leq w\leq0.2$); $(Y,Lu,Gd)_{2-\varphi}Ca_\varphi Si_4N_{6+\varphi}C_{1-\varphi}:Ce^{3+}$, (wherein $0\leq\varphi\leq0.5$); $(Lu,Ca,Li,Mg,Y)$, α-SiAlON doped with $Eu^{2+}$ and/or $Ce^{3+}$; $(Ca,Sr,Ba)SiO_2N_2:Eu^{2+},Ce^{3+}$; β-SiAlON:$Eu^{2+}$,$3.5MgO \cdot 0.5MgF_2 \cdot GeO_2:Mn^{4+}$; $(Sr,Ca,Ba)AlSiN_3:Eu^{2+}$; $(Sr,Ca,Ba)_3SiO_5:Eu^{2+}$; $Ca_{1-c-f}Ce_cEu_fAl_{1+c}Si_{1-c}N_3$, (where $0\leq c\leq0.2$, $0\leq f\leq0.2$); $Ca_{1-h-r}Ce_hEu_rAl_{1-h}(Mg,Zn)_hSiN_3$, (where $0\leq h\leq0.2$, $0\leq r\leq0.2$); $Ca_{1-2s-t}Ce_s(Li,Na)_sEu_tAlSiN_3$, (where $0\leq s\leq0.2$, $0\leq t\leq0.2s+t>0$); and $Ca_{1-\sigma-\chi-\varphi}Ce_\sigma(Li,Na)_\chi Eu_\varphi Al_{1+\sigma-\chi}Si_{1-\sigma+\chi}N_3$, (where $0\leq\sigma\leq0.2$, $0\leq\chi\leq0.4$, $0\leq\varphi\leq0.2$).

In some embodiments, the additional luminescent material includes a green light emitting quantum dot (QD) material. The green light emitting QD material may include a group II-VI compound, a group III V compound, a group IV-IV compound, a group IV compound, a group I-III-VI$_2$ compound or a mixture thereof. Non-limiting examples of group II-VI compounds include CdSe, CdTe, CdS, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or combinations thereof. Group III-V compounds may be selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof. Examples of group IV compounds include Si, Ge, SiC, and SiGe. Examples of group I-III-VI$_2$ chalcopyrite-type compounds include CuInS$_2$, CuInSe$_2$, CuGaS$_2$, CuGaSe$_2$, AgInS$_2$, AgInSe$_2$, AgGaS$_2$, AgGaSe$_2$ and combinations thereof.

QD material for use as the additional luminescent material may be a core/shell QD, including a core, at least one shell coated on the core, and an outer coating including one or more ligands, preferably organic polymeric ligands. Exemplary materials for preparing core-shell QDs include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, HgS, HgSe, HgTe, BeS, BeSe, BeTe, MgS, MgSe, MnS, MnSe, GeS, GeSe, GeTe, SnS, SnSe, SnTe, PbO, PbS, PbSe, PbTe, CuF, CuCl, CuBr, CuI, Si$_3$N$_4$, Ge$_3$N$_4$, Al$_2$O$_3$, (Al, Ga, In)$_2$ (S, Se, Te)$_3$, Al$_2$CO, and appropriate combinations of two or more such materials. Exemplary core-shell QDs include, but are not limited to, CdSe/ZnS, CdSe/CdS, CdSe/CdS/ZnS, CdSeZn/CdS/ZnS, CdSeZn/ZnS, InP/ZnS, PbSe/PbS, PbSe/PbS, CdTe/CdS and CdTe/ZnS.

The QD materials typically include ligands conjugated to, cooperated with, associated with, or attached to their surface. In particular, the QDs may include a coating layer comprising ligands to protect the QDs from environmental conditions including elevated temperatures, high intensity light, external gasses, and moisture, control aggregation, and allow for dispersion of the QDs in the host binder material.

Examples of electroluminescent polymers may include polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole); and polyphenylenevinylene and their derivatives. Materials suitable for use as the phosphorescent dye may include, but are not limited to, tris(1-phenylisoquinoline)iridium (III) (red dye), tris(2-phenylpyridine) iridium (green dye) and Iridium (III) bis(2-(4,6-difluorephenyl) pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

The ratio of each of the individual luminescent materials, for example phosphor of formula I and additional luminescent materials may vary depending on the characteristics of the desired resulting light output from the one or more LED chips. The relative proportions of the individual luminescent materials may be adjusted such that the light emitted from the one or more LED chips is visible light of predetermined x and y values on the chromaticity diagram created by the International Commission on Illumination (CIE). In certain embodiments, theone or more LED chips emit white light. In some embodiments, the resulting white light may possess an x value in a range of about 0.20 to about 0.55, and a y value in a range of about 0.20 to about 0.55. The exact identity and amount of each luminescent material as described herein can be varied according to the needs of the end user.

In some embodiments, the method further includes the step of coupling electrical leads to the one or more coated semiconductor elements to form one or more LED chips, for example the LED chip 12 in FIG. 1. In some embodiments, the electrical leads include metallic wires. The electrical leads may be coupled to the electrical contacts formed on the semiconductor wafer (as described previously) that are present on one or more separated (or diced) coated semiconductor elements. In some embodiments, the coupling step is performed while minimizing or avoiding exposure of the phosphor of formula I in the coating of the composite material to a temperature higher than 200 degrees Celsius. That is, during the coupling step, a temperature may be maintained below 200 degrees Celsius. In some embodiments, the coupling step is performed at a temperatute less than 150 degrees Celsius. In certain embodiments, the coupling step is performed at a temperature less than 100 degrees Celsius.

As used herein, the terms "coupling" and "couple" refer to electrically connecting one element to another element. In some embodiments, the electrical leads are electrically connected to the electrical contacts present on the one or more coated semiconductor elements. Various methods for example, soldering or brazing can be used for electrically connecting the electrical leads to the electrical contacts.

In some embodiments, the coupling step includes soldering the electrical leads to the electrical contacts on the one or more coated semiconductor elements. Suitable soldering materials that can be used at a temperature lower than 200 degrees Celsius are desirable. Some embodiments include using a soldering material that can be used at a temperature lower than 150 degrees Celsius. Suitable soldering materials may include tin, copper, silver, zinc, indium, bismuth, cadmium, lead or combinations thereof. In some embodiments, the soldering material may be substantially free of lead. As used herein, the term "substantially free of lead" refers to a soldering material that includes less than 10 weight percent lead. Further, in some embodiments, the coupling step is performed in an environment that is substantially free of moisture. As used herein, the term "substantially free of moisture" refers to an environment that includes less than 1 percent moisture.

FIG. 2 shows a flow chart of a method 100 for fabricating one or more one or more LED chips, for example LED chip 12 as shown in FIG. 1. The method 100 includes the step 102 of combining a phosphor of formula I, for example K$_2$SiF$_6$:Mn$^{4+}$ and a polymer binder to form a composite material, the step 104 of providing a semiconductor wafer including In$_i$Ga$_j$Al$_k$N, wherein 0≤i; 0≤j; 0≤k, and a sum of I, j and k is equal to 1, the step 106 of coating the composite material on a surface of the semiconductor wafer to form a coated semiconductor wafer, the step 108 of dicing the coated semiconductor wafer using a cutting fluid apparatus to separate one or more coated semiconductor elements, and the step 110 of coupling electrical leads to the one or more coated semiconductor elements to form one or more LED chips. A cutting fluid of the cutting fluid apparatus includes a C$_1$-C$_{20}$ alcohol, a C$_1$-C$_{20}$ ketone, a C$_1$-C$_{20}$ acetate compound, acetic acid, oleic acid, carboxylic acid, a source of A, silicic acid, or a combination thereof.

Some embodiments provide a lighting apparatus including one or more LED chips (for example, LED chip 12 FIG. 1)) fabricated by the method as described herein. The lighting apparatus may include a number of LED chips to generate a desired light output (that is, luminous flux). A light output from an LED chip may depend, in part, on a flux emitted from the LED device structure of the semiconductor substrate. A desired light output from the lighting apparatus may be achieved using a lesser number of LED chips including the LED device structure emitting a high flux or using a higher number of LED chips including the LED device structures emitting a lower flux. In some embodiments, the lighting apparatus may include multiple LED chips including the LED device structures that emit a flux lower than 40 watt/cm². In some embodiments, the lighting apparatus may include multiple LED chips including the LED device structures that emit a flux lower than 30 watt/cm². In some embodiments, the lighting apparatus may include multiple LED chips including the LED device structures that emit a flux lower than 20 watt/cm².

In some embodiments, a method of operating a lighting apparatus as described herein includes operating multiple LED chips including the LED device structures emitting a flux lower than 40 watt/cm². Operating the lighting apparatus including multiple LED chips including the LED device structures emitting a flux, for example less than 40 watt/cm² may reduce or prevent degradation of the phosphor of formula I during the operation of the lighting apparatus and provide improved performance and lower cost driver solutions.

Non-limiting examples of lighting apparatus include devices for excitation by light-emitting diodes (LEDs) such as fluorescent lamps, cathode ray tubes, plasma display devices, liquid crystal displays (LCD's), ultraviolet (UV) excitation devices, such as chromatic lamps, backlighting devices, liquid crystal displays (LCD), plasma screens, xenon excitation lamps, and UV excitation marking systems. The list of these devices is meant to be merely exemplary and not exhaustive. In some embodiments, the lighting apparatus includes a backlight device. The backlight device may include a surface mounted device (SMD) structure. Examples of the backlight devices include, but are not limited to, televisions, computers, monitors, smartphones, tablet computers and other handheld devices.

The method steps described above may be used in additional applications besides LED chips. For example, the method steps of combining and disposing a composite material as described herein may be used in a fluorescent lamp, a cathode ray tube, a plasma display device or a liquid crystal display (LCD). The method steps may also be used for fabricating a scintillator in an electromagnetic calorimeter, a gamma ray camera, a computed tomography scanner or a laser. These uses are meant to be merely exemplary and not exhaustive.

EXAMPLES

Example 1

To analyze the effect of various fluids on the phosphor of formula $K_2SiF_6:Mn^{4+}$, various sample combinations were prepared by adding 0.8 gram phosphor $K_2SiF_6:Mn^{4+}$ individually in various fluids 1-7 (10 milliliters) as provided in Table 1. Each sample combination was magnetically stirred for 30 minutes at 175 rpm. After stirring, each sample combination was filtered and dried overnight under vacuum to receive treated samples of phosphor $K_2SiF_6:Mn^{4+}$. Each treated sample of phosphor $K_2SiF_6:Mn^{4+}$ was characterized to measure quantum efficiency (QE) and absorption (Abs.). Table 1 shows relative QEs and relative Abs. of the treated samples 1-7 of phosphor $K_2SiF_6:Mn^{4+}$ (corresponding to the fluids 1-7 used in preparing the sample combinations) with respect to as-prepared phosphor $K_2SiF_6:Mn^{4+}$.

As shown in Table 1, the performance of the treated sample 1 of phosphor $K_2SiF_6:Mn^{4+}$ reduced drastically (50% drop in QE) when the phosphor $K_2SiF_6:Mn^{4+}$ was exposed to water (fluid 1). As compared to water, the treated samples 2-7 of phosphor $K_2SiF_6:Mn^{4+}$ in fluids 2-7 showed much lower reduction in QEs. This implies that the phosphor $K_2SiF_6:Mn^{4+}$ has higher stability in fluids (2-7) than the stability of phosphor $K_2SiF_6:Mn^{4+}$ in water. As shown in table 1, QE of the treated sample 7 of phosphor $K_2SiF_6:Mn^{4+}$ decreased only by 7% in aqueous IPA (50% IPA+50% water).

TABLE 1

| S. No. | Fluids | Treated samples of phosphor | Relative QE | Relative Abs. |
|---|---|---|---|---|
| Fluid 1 | Water | Treated sample 1 | 50% | 76% |
| Fluid 2 | Isopropyl alcohol (IPA) | Treated sample 2 | 96% | 70% |
| Fluid 3 | Acetone | Treated sample 3 | 98% | 70% |
| Fluid 4 | Ethanol | Treated sample 4 | 96% | 70% |
| Fluid 5 | t-butyl-acetate | Treated sample 5 | 99% | 70% |
| Fluid 6 | 9 ml IPA + 1 ml water | Treated sample 5 | 96% | 70% |
| Fluid 7 | 5 ml IPA + 5 ml water | Treated sample 6 | 93% | 70% |

Example 2

Two samples (samples 1 and 2) were prepared using the phosphor $K_2SiF_6:Mn^{4+}$. The sample 1 was prepared by stirring 1.0 gram phosphor $K_2SiF_6:Mn^{4+}$ in 10 ml water for 3 hours. The sample 2 was prepared by stirring 1.0 gram phosphor $K_2SiF_6:Mn^{4+}$ and 0.1 gram $K_2SiF_6$ in 10 ml water for 5 hours. As-prepared samples 1 and 2 were yellow in color. It was observed that sample 1 turned brown after 3 hours, which showed performance degradation of the phosphor $K_2SiF_6:Mn^{4+}$ in sample 1. On the other hand, sample 2 showed minimal change in the color. The sample 2 remained yellow in color. The minimal change in the color of sample 2 indicated improved stability of the phosphor $K_2SiF_6:Mn^{4+}$ in presence of $K_2SiF_6$ in water.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method, comprising:
    combining a phosphor of formula I and a polymer binder to form a composite material, wherein the phosphor of formula I is represented as:

$$A_x[(M,Mn)F_y] \quad (I)$$

providing a semiconductor wafer comprising $In_iGa_jAl_kN$, wherein 0≤i; 0≤j; 0≤k, and wherein a sum of I, j and k is equal to 1;
    coating the composite material on a surface of the semiconductor wafer to form a coated semiconductor wafer; and
    dicing the coated semiconductor wafer using a cutting fluid apparatus to form one or more coated semiconductor elements, wherein a cutting fluid of the cutting fluid apparatus comprises a $C_1$-$C_{20}$ alcohol, a $C_1$-$C_{20}$ ketone, a source of A, silicic acid, or a combination thereof, wherein A independently at each occurance is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge of an [(M, Mn)$F_y$] ion; and y is 5, 6, or 7.

2. The method according to claim 1, wherein the cutting fluid comprises ethanol, acetone, isopropyl alcohol, tertiary butyl alcohol, or a combination thereof.

3. The method according to claim 1, wherein the source of A comprises KF, KCl, KBr, $CaF_2$, a compound of formula II, or a combination thereof, $$A_x[MF_y]  \qquad \text{II.}$$

4. The method according to claim 1, wherein the step of combining the phosphor of formula I and the polymer binder comprises mixing the phosphor of formula I and the polymer binder homogeneously with a stirring rate less than 500 rpm.

5. The method according to claim 4, wherein the stirring rate is less than 300 rpm.

6. The method according to claim 1, wherein the polymer binder is substantially free of water, substantially free of a base, or substantially free of water and the base.

7. The method according to claim 1, wherein the polymer binder comprises a silicone or a silicone derivative, an epoxy or a low temperature glass.

8. The method according to claim 1, further comprising heat-treating the coated semicondutor wafer prior to dicing the coated semiconductor wafer, wherein the step of heat-treating is carried out at a temperature less than 200 degrees Celsius.

9. The method according to claim 8, wherein the temperature is less than 150 degrees Celsius.

10. The method according to claim 1, further comprising coupling electrical leads to the one or more coated semicondutor elements to form one or more LED chips.

11. The method according to claim 1, wherein A is K and M is Si.

12. A method, comprising:
combining $K_2[SiF_6]$:$Mn^{4+}$ and a polymer binder to form a composite material;
providing a semiconductor wafer comprising $In_iGa_jAl_kN$, wherein 0≤i; 0≤j; 0≤k, and wherein a sum of I, j and k is equal to 1;
coating the composite material on a surface of the semiconductor wafer to form a coated semicondutor wafer;
dicing the coated semiconductor wafer using a cutting fluid apparatus to form one or more coated semiconductor elements, wherein a cutting fluid of the cutting fluid apparatus comprises $K_2[SiF_6]$; and
coupling electrical leads to the one or more coated semiconductor elements to form one or more LED chips.

* * * * *